US011043429B2

(12) United States Patent
Xu et al.

(10) Patent No.: US 11,043,429 B2
(45) Date of Patent: Jun. 22, 2021

(54) SEMICONDUCTOR FINS WITH DIELECTRIC ISOLATION AT FIN BOTTOM

(71) Applicant: INTERNATIONAL BUSINESS MACHINES CORPORATION, Armonk, NY (US)

(72) Inventors: Peng Xu, Santa Clara, CA (US); Kangguo Cheng, Schenectady, NY (US); Jay W. Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/741,823

(22) Filed: Jan. 14, 2020

(65) Prior Publication Data

US 2020/0152520 A1 May 14, 2020

Related U.S. Application Data

(62) Division of application No. 15/949,602, filed on Apr. 10, 2018, now Pat. No. 10,636,709.

(51) Int. Cl.
| | |
|---|---|
| *H01L 21/8234* | (2006.01) |
| *H01L 29/06* | (2006.01) |
| *H01L 21/762* | (2006.01) |
| *H01L 21/311* | (2006.01) |
| *H01L 27/088* | (2006.01) |

(52) U.S. Cl.
CPC ........ *H01L 21/823481* (2013.01); *H01L 21/31111* (2013.01); *H01L 21/76224* (2013.01); *H01L 21/823431* (2013.01); *H01L 27/0886* (2013.01); *H01L 29/0649* (2013.01)

(58) Field of Classification Search
None
See application file for complete search history.

(56) References Cited

U.S. PATENT DOCUMENTS

| | | |
|---|---|---|
| 7,101,763 B1 | 9/2006 | Anderson et al. |
| 8,395,195 B2 | 3/2013 | Chang et al. |
| 8,951,850 B1 | 2/2015 | He et al. |
| 9,331,146 B2 | 5/2016 | Chen et al. |
| 9,431,306 B2 | 8/2016 | Jacob et al. |
| 9,478,549 B2 | 10/2016 | Cheng et al. |
| 9,620,590 B1 | 4/2017 | Bergendahl et al. |

(Continued)

OTHER PUBLICATIONS

List of IBM Patents or Patent Applications Treated as Related dated Jan. 14, 2020, 2 pages.

*Primary Examiner* — Mounir S Amer
(74) *Attorney, Agent, or Firm* — Tutunjian & Bitetto, P.C.; Randall Bluestone (57) ABSTRACT

A method is presented for forming dielectric isolated fins. The method includes forming a plurality of fin structures over a semiconductor substrate, forming spacers adjacent each of the plurality of fins, recessing the semiconductor substrate to form bottom fin profiles, and forming shallow trench isolation (STI) regions between the plurality of fins and the bottom fin profiles. The method further includes etching the STI regions, a select number of the plurality of fins, and a portion of a select number of the bottom fin profiles to create cavities between a mechanical anchor defined between a pair of fins of the plurality of fins, the etching resulting in undercutting of remaining fins.

19 Claims, 7 Drawing Sheets

(56) References Cited

U.S. PATENT DOCUMENTS

| | | |
|---|---|---|
| 9,627,245 B2 | 4/2017 | Jacob et al. |
| 2014/0091394 A1* | 4/2014 | Li .................... H01L 29/66795 |
| | | 257/368 |
| 2015/0187943 A1* | 7/2015 | Lee ..................... H01L 21/3065 |
| | | 257/192 |
| 2015/0318215 A1 | 11/2015 | Taylor, Jr. et al. |
| 2016/0064417 A1 | 3/2016 | Ponoth et al. |
| 2016/0284802 A1 | 9/2016 | Akarvardar et al. |
| 2017/0133264 A1* | 5/2017 | Kim .................... H01L 27/1104 |
| 2018/0102363 A1* | 4/2018 | Li .................... H01L 21/823821 |
| 2019/0245037 A1* | 8/2019 | Van Dal ................. H01L 29/20 |

* cited by examiner

SEMICONDUCTOR FINS WITH DIELECTRIC ISOLATION AT FIN BOTTOM

BACKGROUND

Technical Field

The present invention relates generally to semiconductor devices, and more specifically, to forming semiconductor fins with dielectric isolation at fin bottom on a bulk semiconductor.

Description of the Related Art

In recent years, with increases in the degree of integration, functionality, and speed of semiconductor devices, there is an increasing demand for miniaturization of semiconductor devices. To meet the demand, various device structures have been proposed for reducing an area occupied by transistors over a substrate. Among them, a field effect transistor (FET) having a fin-type structure has drawn attention. The FET having the fin-type structure is generally called a fin field effect transistor (FinFET), and has an active region made of a semiconductor region having a thin-wall (fin) shape perpendicular to the principal surface of a substrate. In the FinFET, the side surfaces of the fin-type semiconductor region can be used as channel surfaces, and accordingly the area occupied by transistors over the substrate can be reduced.

SUMMARY

In accordance with an embodiment, a method is provided for forming dielectric isolated fins. The method includes forming a plurality of fins over a semiconductor substrate, forming spacers adjacent each of the plurality of fins, recessing the semiconductor substrate to form bottom fin profiles, forming shallow trench isolation (STI) regions between the plurality of fins and the bottom fin profiles, and etching the STI regions, a select number of the plurality of fins, and a portion of a select number of bottom fin profiles to create cavities on opposed ends of a mechanical anchor defined between a pair of fins of the plurality of fins, the etching resulting in undercutting of remaining fins.

In accordance with another embodiment, a method is provided for forming dielectric isolated fins. The method includes forming a plurality of fins over a semiconductor substrate, recessing the semiconductor substrate to form tapered bottom fin profiles, forming shallow trench isolation (STI) regions between the plurality of fins and the tapered bottom fin profiles, and undercutting the plurality of fins via a three-stage etch process.

In accordance with yet another embodiment, a semiconductor structure is provided for constructing dielectric isolated fins. The semiconductor structure includes a plurality of fins disposed over a semiconductor substrate, spacers disposed adjacent each of the plurality of fins, bottom fin profiles constructed by recessing the semiconductor substrate, shallow trench isolation (STI) regions disposed between the plurality of fins and the bottom fin profiles, and cavities created on opposed ends of a mechanical anchor, the cavities causing undercutting of each of the plurality of fins.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming semiconductor fins with dielectric isolation. Electrical isolation of fin structures is necessary in order to avoid parasitic leakage paths between various devices. Isolating fin structures on a bulk silicon wafer becomes an issue as the silicon of the bulk silicon wafer between the fin structures forms a conduction path. Shallow trench isolation (STI) is a technique used to electrically isolate transistors or electrical devices. STI is created early during the semiconductor device fabrication process, before the transistors are formed. The dielectric isolation material or STI can be employed to completely isolate the fin channels from one another and the substrate. The isolation material tends to reduce leakage between neighboring fin field effect transistor (FinFET) devices as well as decrease leakage current between the source and drain that travels through the substrate in a conventional bulk FinFET device.

Embodiments in accordance with the present invention provide methods and devices for employing semiconductor fins with dielectric isolation at fin bottom on a bulk semiconductor substrate by using a fin cut mask to reach and undercut the fin bottom while using STI dielectric between fins as a mechanical anchor to hold the fins stable after undercutting. The fin bottom is then filled with a dielectric to form fins with dielectric at the fin bottom. As a result, semiconductor fins can be formed on a bulk semiconductor substrate with dielectric isolation at the fin bottom.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
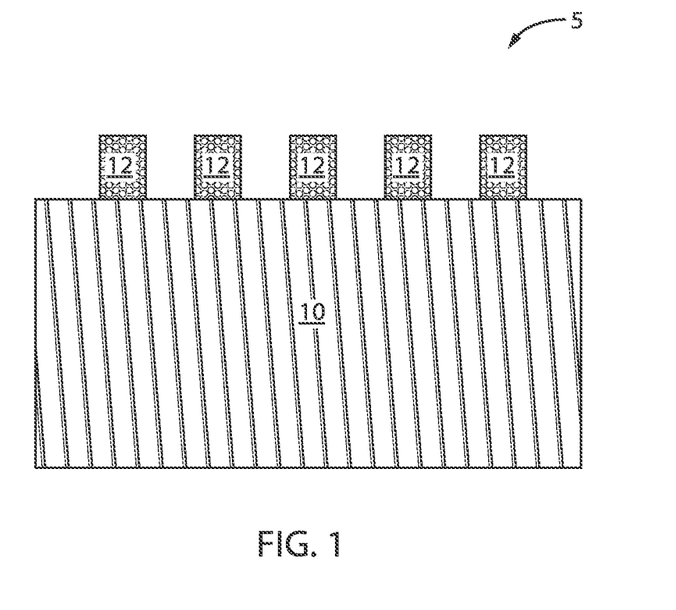
FIG. 1 is a cross-sectional view of a semiconductor structure including a fin hardmask deposited on a semiconductor substrate, in accordance with an embodiment of the present invention.

FIG. 1 is a cross-sectional view of a semiconductor structure including a fin hardmask deposited on a semiconductor substrate, in accordance with an embodiment of the present invention.

The semiconductor structure 5 includes a substrate 10 and a plurality of fin hardmasks 12 formed thereon.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

The hardmask 12 can be manufactured of silicon nitride (SiN), deposited using, for example, low pressure chemical vapor deposition (LPCVD). In other example embodiments, the hardmask 12 can include, but is not limited to, hafnium oxide ($HfO_2$) or tantalum nitride (TaN) or titanium nitride (TiN). In some embodiments, the hardmask 12 can include multiple layers, for example, silicon nitride on top of silicon oxide. In some embodiments, the vertical thickness of the hardmask 12 ranges from about 30 nm to about 150 nm. The hardmask can be formed by any suitable patterning technique, including but not limited to, sidewall image transfer (SIT), self-aligned double patterning (SADP), self-aligned quadruple patterning (SAQP), lithography followed by etching, etc.

Figure 2:
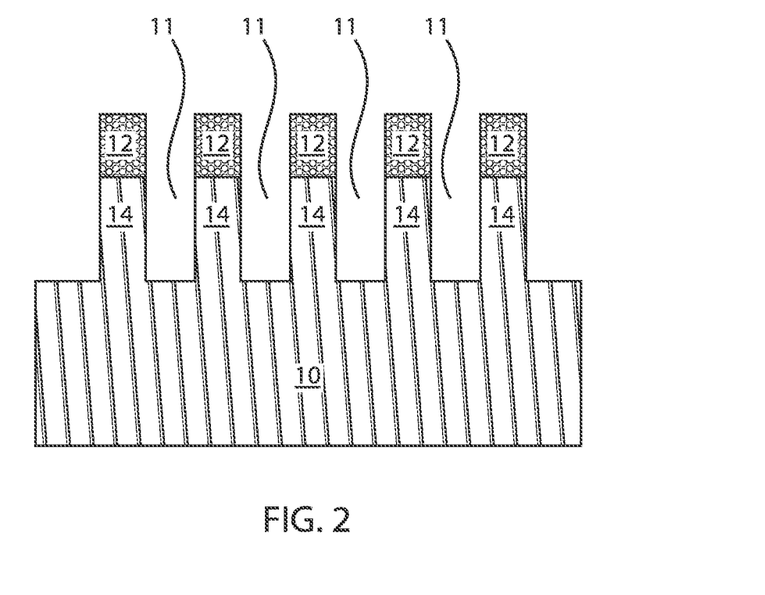
FIG. 2 is a cross-sectional view of the semiconductor structure of FIG. 1 where a plurality of fins are formed after etching the semiconductor substrate, in accordance with an embodiment of the present invention.

FIG. 2 is a cross-sectional view of the semiconductor structure of FIG. 1 where a plurality of fins are formed after etching the semiconductor substrate, in accordance with an embodiment of the present invention.

In various exemplary embodiments, the substrate 10 is etched to form channels or troughs or trenches 11 between a plurality of fins 14. The plurality of fins 14 have a width equal to the width of the hardmask 12.

The plurality of fin structures 14 are formed from the substrate 10, which includes a semiconductor material including, but not limited to Si, strained Si, SiC, SiGe, SiGeC, Si alloys, Ge, Ge alloys, GaAs, InAs, InP as well as other III/V and II/VI compound semiconductors. The plurality of fin structures 14 are etched using a reactive ion etch (RIE) or the like. The etching can include a dry etching process such as, for example, reactive ion etching, plasma etching, ion etching or laser ablation. The etching can further include a wet chemical etching process in which one or more chemical etchants are employed to remove portions of the layers.

The plurality of fins 14 can be, e.g., silicon (Si) fins. In another exemplary embodiment, the plurality of fins 14 can be, e.g., silicon germanium (SiGe) fins. Yet in another exemplary embodiment, some of fins 14 can be a material that is different from the other fins. For example, some fins can be silicon fins while others can be silicon germanium (SiGe) fins. One skilled in the art can contemplate forming fins 14 from any type of materials.

The overall size, shape and configuration of the trenches 11 and the fin structures 14 can vary depending on the particular application. The depth and width of the trenches 11 as well as the height and width of the fin structures 14 can vary depending upon the particular application. In one illustrative embodiment, the width of the trenches 11 can range from about 8-30 nm. In some embodiments, the fin structures 14 can have a width within the range of about 5-20 nm. In some embodiments, the fin structures 14 can have a depth within the range of about 20-60 nm. The fin structures 14 can be formed to any desired pitch.

Figure 3:
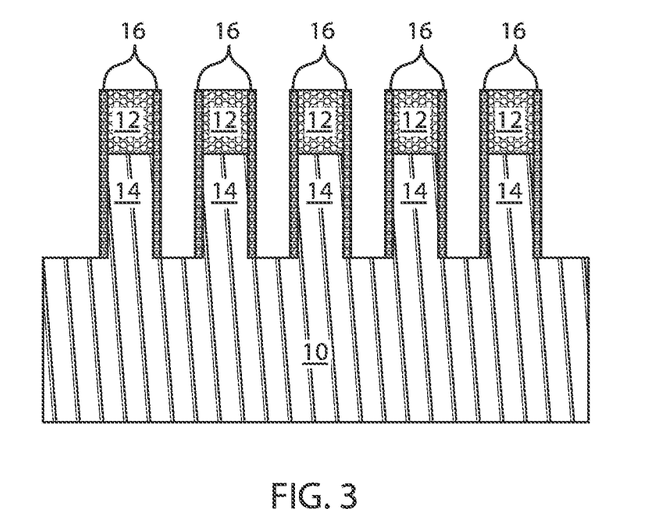
FIG. 3 is a cross-sectional view of the semiconductor structure of FIG. 2 where spacers are formed adjacent the plurality of fins, in accordance with an embodiment of the present invention.

FIG. 3 is a cross-sectional view of the semiconductor structure of FIG. 2 where spacers are formed adjacent the plurality of fins, in accordance with an embodiment of the present invention.

In various exemplary embodiments, spacers 16 are shown formed adjacent the plurality of fins 14. The spacers 16 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride. The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE). In some embodiments, the spacer 16 has a thickness within the range of about 2-10 nm.

Figure 4:
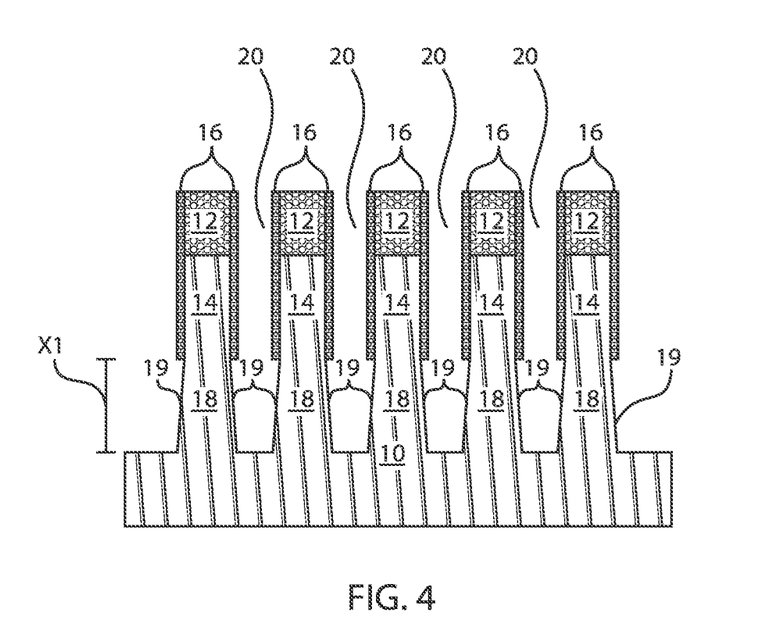
FIG. 4 is a cross-sectional view of the semiconductor structure of FIG. 3 where the semiconductor substrate is further etched to form tapered fin bottom sections, in accordance with an embodiment of the present invention.

FIG. 4 is a cross-sectional view of the semiconductor structure of FIG. 3 where the semiconductor substrate is further etched to form tapered fin bottom sections, in accordance with an embodiment of the present invention.

In various exemplary embodiments, the substrate 10 is further etched to form a bottom or lower or distal fin profile 18. Also, the substrate 10 is etched to form channels or troughs 20 between the plurality of fins 14 and extending between the plurality of bottom fin profiles 18. The bottom fin profiles 18 can define a tapered configuration 19. In other words, the sidewalls 19 of the bottom sections 18 of the fins 14 can be tapered. However, it is contemplated that the sidewalls of the bottom sections 18 of the fins 14 can be substantially vertical. The bottom fin profile 18 can extend a distance X1 below each fin 14. The bottom fin profile 18 can create a substantially U-shaped or V-shaped or cup-shaped configuration between each of the plurality of bottom fin profiles 18 (or between the plurality of fins 14). In some embodiments, bottom fin profile 18 has a depth within the range of about 20-60 nm.

Figure 5:
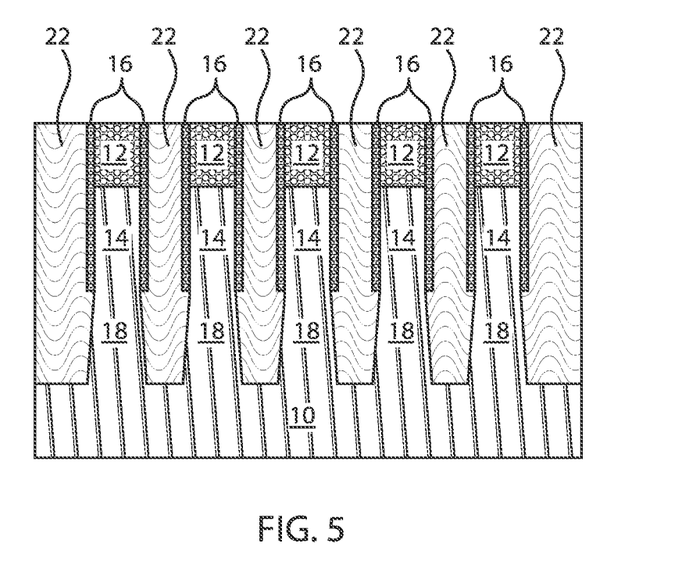
FIG. 5 is a cross-sectional view of the semiconductor structure of FIG. 4 where a dielectric fill takes place, in accordance with an embodiment of the present invention.

FIG. 5 is a cross-sectional view of the semiconductor structure of FIG. 4 where a dielectric fill takes place, in accordance with an embodiment of the present invention.

In an exemplary embodiment, dielectric 22 is deposited within the channels or troughs or trenches 20 between the plurality of fins 14 and the plurality of bottom fin profiles 18. The dielectric 22 directly contacts the spacers 16 and the sidewall surfaces 19 of the bottom sections or bottom fin profiles 18. The dielectric 22 can be an oxide. The oxide 22 can be referred to as a shallow trench isolation (STI) structure or region.

The dielectric 22 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

In some embodiments, the dielectric 22 includes multiple materials. The dielectric 22 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

The dielectric 22 can be planarized. The planarizing process can include chemical mechanical polishing (CMP) followed by an etch process. Therefore, the planarization process can be provided by CMP. Other planarization processes can include grinding and polishing.

Figure 6:
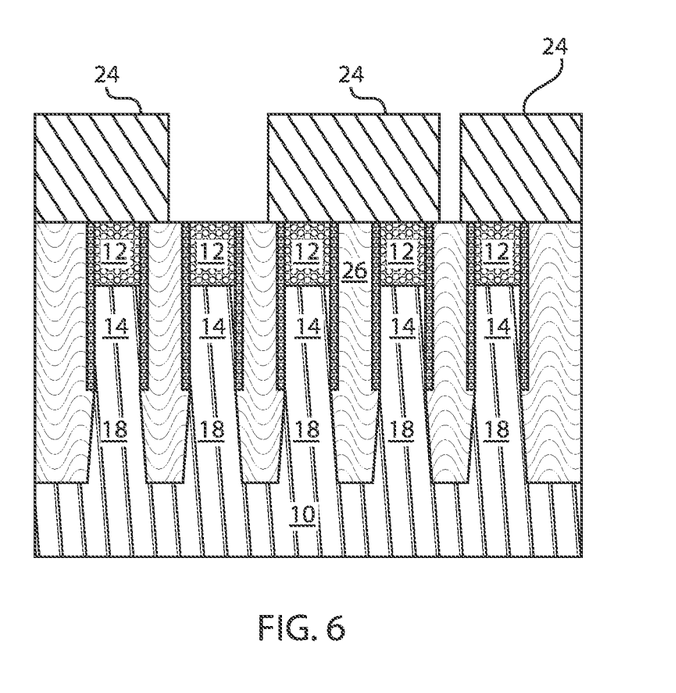
FIG. 6 is a cross-sectional view of the semiconductor structure of FIG. 5 where a mask is formed over portions of the semiconductor structure, in accordance with an embodiment of the present invention.

FIG. 6 is a cross-sectional view of the semiconductor structure of FIG. 5 where a mask is formed over portions of the semiconductor structure, in accordance with an embodiment of the present invention.

In an exemplary embodiment, a mask 24 is formed over portions of the semiconductor structure. The block mask 24 can include soft and/or hard mask materials and can be formed by deposition, photolithography and etching. In one embodiment, the block mask 24 includes a photoresist. A photoresist block mask can be produced by applying a photoresist layer, exposing the photoresist layer to a pattern of radiation, and then developing the pattern into the photoresist layer utilizing conventional resist developer. Block masks 24 can have a thickness ranging from about 10 nm to about 300 nm.

In one embodiment, the block mask 24 is a hard mask composed of a nitride-containing material, such as silicon nitride (SiN). It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

The mask 24 can be placed over a select number fins 14. The mask 24 can cover a select number of dielectric pillars. In one example embodiment, the dielectric pillars are oxide pillars. The mask 24 can serve at least two purposes. In one instance, the mask 24 can aid in the removal of undesired fins 14. In another instance, the mask 24 can cover at least one oxide pillar 26 between a pair of fins. The oxide pillar 26 can serve as a mechanical anchor to hold the fins 14 during a later fin undercut process. The oxide pillar 26 is employed to prevent fin collapsing. The oxide pillar 26 can be a shallow trench isolation (STI) region. The STI itself acts as the mechanical anchor.

Figure 7:
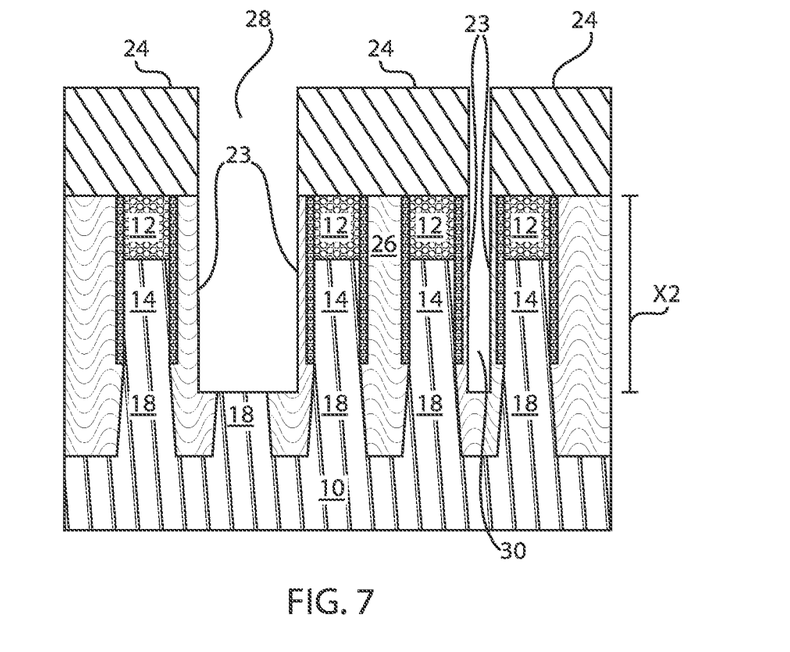
FIG. 7 is a cross-sectional view of the semiconductor structure of FIG. 6 where the exposed portions of fins and dielectric are etched away, in accordance with an embodiment of the present invention.

FIG. 7 is a cross-sectional view of the semiconductor structure of FIG. 6 where the exposed portions of fins and dielectric are etched away, in accordance with an embodiment of the present invention.

In an exemplary embodiment, a first fin cut etch takes place. The fin cut results in a first recess 28 and a second recess 30. The recesses 28, 30 extend a distance X2 into the semiconductor structure. The fin cut results in removal of fin sections as well as oxide sections. The fin cut results in remaining oxide sections 23 formed adjacent spacers 16 of remaining fins 14. The fin cut of FIG. 7 can be a first etch step in a multi-step etch process.

In one example embodiment, the plurality of fins 14 can be etched by, e.g., a dry etch such as plasma etch or reactive ion etch. Alternatively, the plurality of fins 14 can be etched by a wet etch. Non-limiting examples of wet etch processes that can be used to form the recess include potassium hydroxide (KOH), ammonium hydroxide (ammonia), tetramethylammonium hydroxide (TMAH), hydrazine, or ethylene diamine pyrocatechol (EDP), or any combination thereof.

Figure 8:
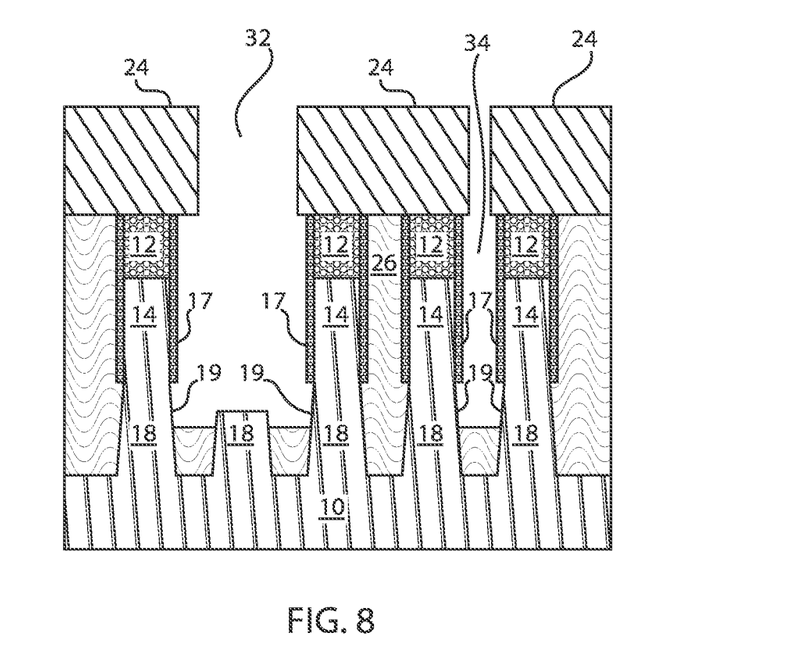
FIG. 8 is a cross-sectional view of the semiconductor structure of FIG. 7 where remaining dielectric portions are etched to expose one or more of the tapered fin bottom sections, in accordance with an embodiment of the present invention.

FIG. 8 is a cross-sectional view of the semiconductor structure of FIG. 7 where remaining dielectric portions are etched to expose one or more of the tapered fin bottom sections, in accordance with an embodiment of the present invention.

In an exemplary embodiment, a second fin cut etch takes place. The second fin cut results in the removal of the remaining oxide sections 23. The second fin cut further results in wider recesses 32, 34 being formed within the semiconductor structure. The second fin cut of the multi-step etch process also exposes sidewalls 17 of spacers 16 and one or more sidewalls 19 of bottom fin profiles 18. Thus, the tapered section of the bottom fin profiles 18 are also further partially exposed for a number of remaining fins 14. The second fin cut can be, e.g., an isotropic etch to expose the lower or bottom portions of the fins. In this step, the sidewalls of the fins 14 are protected by the spacers 16. Therefore, there is no damage to the fins 14 due to the etching steps.

The step of isotropically etching the oxide layer can include employing a highly controllable and precise chemical oxide removal process, such as a chemical oxide removal (COR) process, a Siconi™ dry chemical etch process, or a chemical oxide removal process using dilute and buffered hydrofluoric acid. The COR process selectively etches exposed surfaces of the oxide layer or oxide sections 23. The COR process generally includes exposing surfaces of the oxide layer to process gases, and heat treating the chemically treated oxide surface layer. The COR process can include exposing the structure to a gaseous or vaporous mixture of HF and ammonia at a pressure of about 30 mTorr or below, preferably at a pressure from about 1 mTorr to about 30 mTorr. Alternatively, the step of isotropically etching the oxide layer can include employing a wet etch processing, but is not limited to, buffered hydrofluoric acid (BHF), diluted hydrofluoric acid (DHF), hydrofluoric acid (HF), HF diluted by ethylene glycol (HFEG), or any combination thereof.

Figure 9:
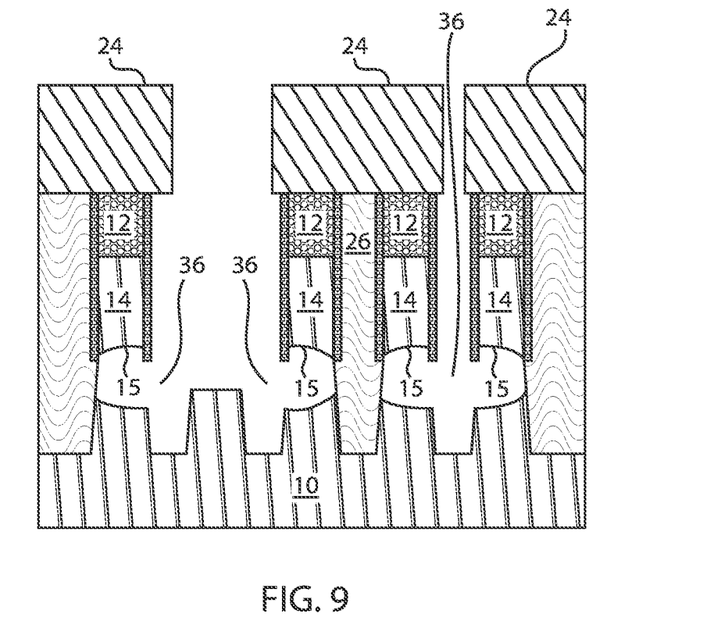
FIG. 9 is a cross-sectional view of the semiconductor structure of FIG. 8 where a portion of the exposed one or more tapered fin bottom sections are etched and lower portions of the fins are etched, in accordance with an embodiment of the present invention.

FIG. 9 is a cross-sectional view of the semiconductor structure of FIG. 8 where a portion of the exposed one or more tapered fin bottom sections are etched and lower portions of the fins are etched, in accordance with an embodiment of the present invention.

In an exemplary embodiment, a third fin cut etch takes place. The third fin cut results in the removal of a portion of the exposed tapered fin bottom sections 18, as well as removal of a portion of a bottom section of the fins 14. The removal of the bottom section of fins 14 results in a curved or rounded or bowed or arched region 15 formed underneath the fins 14. The region 15 can also be referred to as an irregular region or non-uniform region or nonlinear region. Additionally, the third fin cut results in regions or gaps or cavities 36 formed with the removal of the portions of the exposed tapered fin bottom sections 18. The regions or gaps or cavities 36 can assume a substantially circular or oval or spherical shape. The regions or gaps or cavities 36 can extend between exposed oxide pillars. Each pair of fins 14 is thus anchored by oxide between them. For example, oxide pillar 26 anchors fins 14 on opposed ends thereof. Oxide pillar 26 can be referred to as an STI region. The STI region is employed as an anchor to prevent fin collapsing. Thus, full dielectric isolation can be achieved, which means that the entirety of the fins are isolated from the substrate 10 by a dielectric (e.g., STI region), as described further below with reference to FIG. 10.

Therefore, FIGS. 7-9 illustrate a 3-step fin cut etch process. In other words, the etching occurs in multiple stages. The first stage can be, e.g., a non-selective RIE etch, the second stage can be, e.g., an isotropic oxide etch, and the third stage can be, e.g., a Si isotropic etch. The multi-step etch process allows for more precise control in the removal of certain elements (fins, oxide, etc.) within the semiconductor structure.

Figure 10:
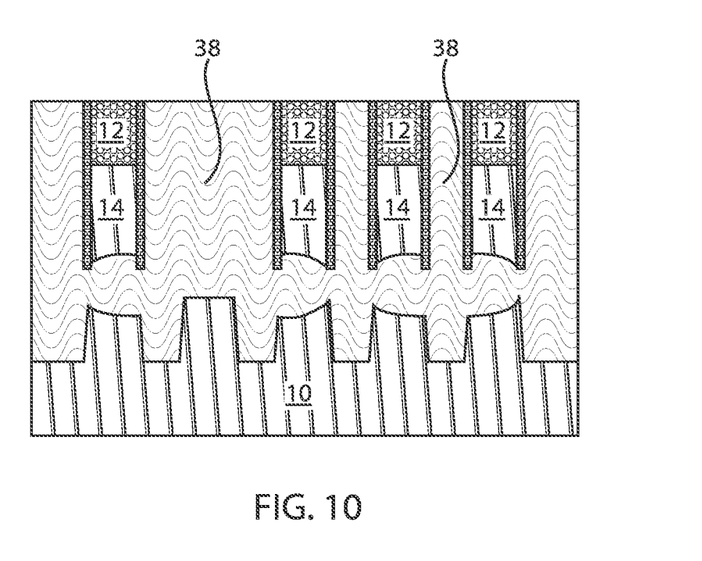
FIG. 10 is a cross-sectional view of the semiconductor structure of FIG. 9 where the mask is removed and an oxide fills the gap regions formed by the etching steps, in accordance with an embodiment of the present invention.

FIG. 10 is a cross-sectional view of the semiconductor structure of FIG. 9 where the mask is removed and an oxide fills the gap regions formed by the etching steps, in accordance with an embodiment of the present invention.

In an exemplary embodiment, the mask 24 is removed and the recesses 32, 34 and the gaps or regions or cavities 36 formed under the exposed fins 14 are filled with a dielectric 38. The dielectric 38 can be, e.g., an oxide, a nitride, an oxynitride, or any suitable dielectric material, or any suitable combination of dielectric materials. The oxide 38 can be planarized such that it is flush with a top surface of the hardmasks 12. In some embodiments, the dielectric 38 and the dielectric 26 have the same material.

Figure 11:
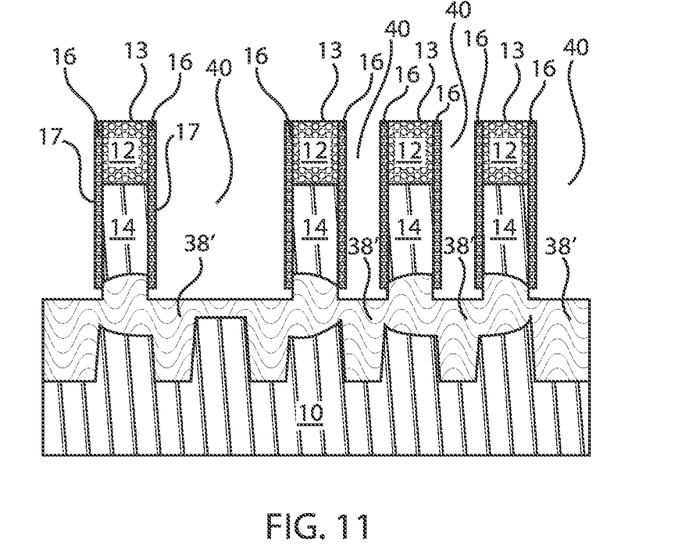
FIG. 11 is a cross-sectional view of the semiconductor structure of FIG. 10 where the oxide is recessed to reveal the fins with spacers and hardmasks, in accordance with an embodiment of the present invention.

FIG. 11 is a cross-sectional view of the semiconductor structure of FIG. 10 where the oxide is recessed to reveal the fins with spacers and hardmasks, in accordance with an embodiment of the present invention.

In an exemplary embodiment, the oxide 38 is recessed by, e.g., an isotropic etch followed by a RIE process to reveal the spacers 16 and the top surface 13 of the hardmask 12. The remaining oxide 38' resides at a bottom portion of the fins 14. The oxide recess results in channels 40 formed between the fins 14. The oxide 38' extends underneath the fins 14 and in between the spacers 16. The oxide 38' can have a curved or bowed or arched or nonlinear or irregular profile directly underneath the fins 14. The oxide 38' can have an asymmetrical or irregular or non-uniform shape or profile across a length of the semiconductor structure. The oxide 38' extends in a continuous manner over the substrate 10. The oxide 38' directly contacts all the fins 14. The irregular shape of the oxide 38' can include multiple curved or bowed or arched or irregular portions or sections. The curved portions or sections can be aligned with the fins 14. The oxide 38' can define substantially U-shaped or V-shaped or cup-shaped sections or configurations or profiles 46 between the fins 14. The cup-shaped portions 46 can be referred to as projections or protrusions extending into the substrate 10.

Figure 12:
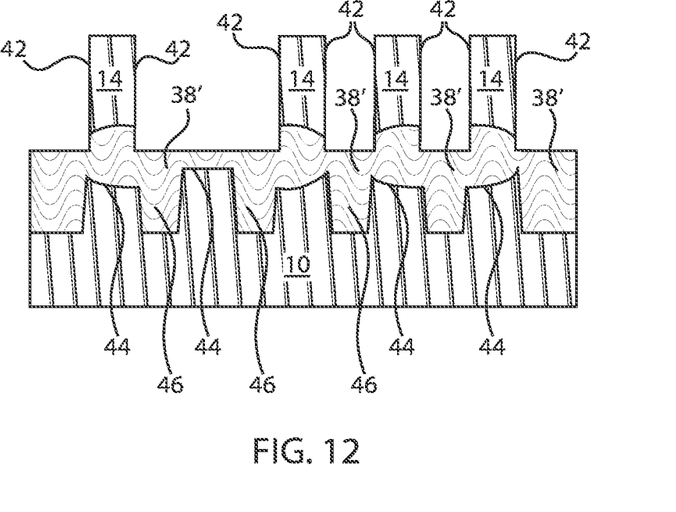
FIG. 12 is a cross-sectional view of the semiconductor structure of FIG. 11 where the hardmasks and spacers are removed to reveal the fins over the irregular-shaped oxide, in accordance with an embodiment of the present invention.

FIG. 12 is a cross-sectional view of the semiconductor structure of FIG. 11 where the hardmasks and spacers are removed to reveal the fins over the oxide, in accordance with an embodiment of the present invention. Fins can be used to fabricate a FinFET or any other suitable fin-type devices.

In an exemplary embodiment, the spacers 16 and the hardmasks 12 are stripped to expose side surfaces 42 of the fins 14 and to thus commence transistor fabrication. Thus, the fins 14 are now formed over an asymmetrical or irregular fin bottom oxide profile 38' connecting or directly contacting all the fins 14. The asymmetrical or irregular fin bottom oxide profile 38' includes a plurality of curved or non-linear sections 44. Several of the curved or non-linear or rounded or arched sections 44 are vertically aligned with the fins 14. Certain curved sections extend into the bottom portion of the fins 14. Therefore, the fins 14 do not have a substantially rectangular profile. Instead, each of the fins 14 has at least one non-linear or curved or arched or rounded surface. Consequently, each fin 14 can have a different vertical height, e.g., the fin height on one side of the fin is greater than the fin height on the other side of the fin. The height difference can be attributed to the irregular shape at the bottom of the fin created by the third fin cut etch.

Therefore, in conclusion, the exemplary embodiments of the present invention employ semiconductor fins with dielectric isolation at fin bottom on a bulk semiconductor substrate by using the fin cut mask to reach and undercut the fin bottom while using shallow trench isolation (STI) dielectric between fins as a mechanical anchor to hold the fins stable after undercutting. The fin bottom is then filled with a dielectric to form fins with dielectric at the fin bottom. As a result, semiconductor fins can be formed on a bulk semiconductor substrate with dielectric isolation at the fin bottom.

Figure 13:
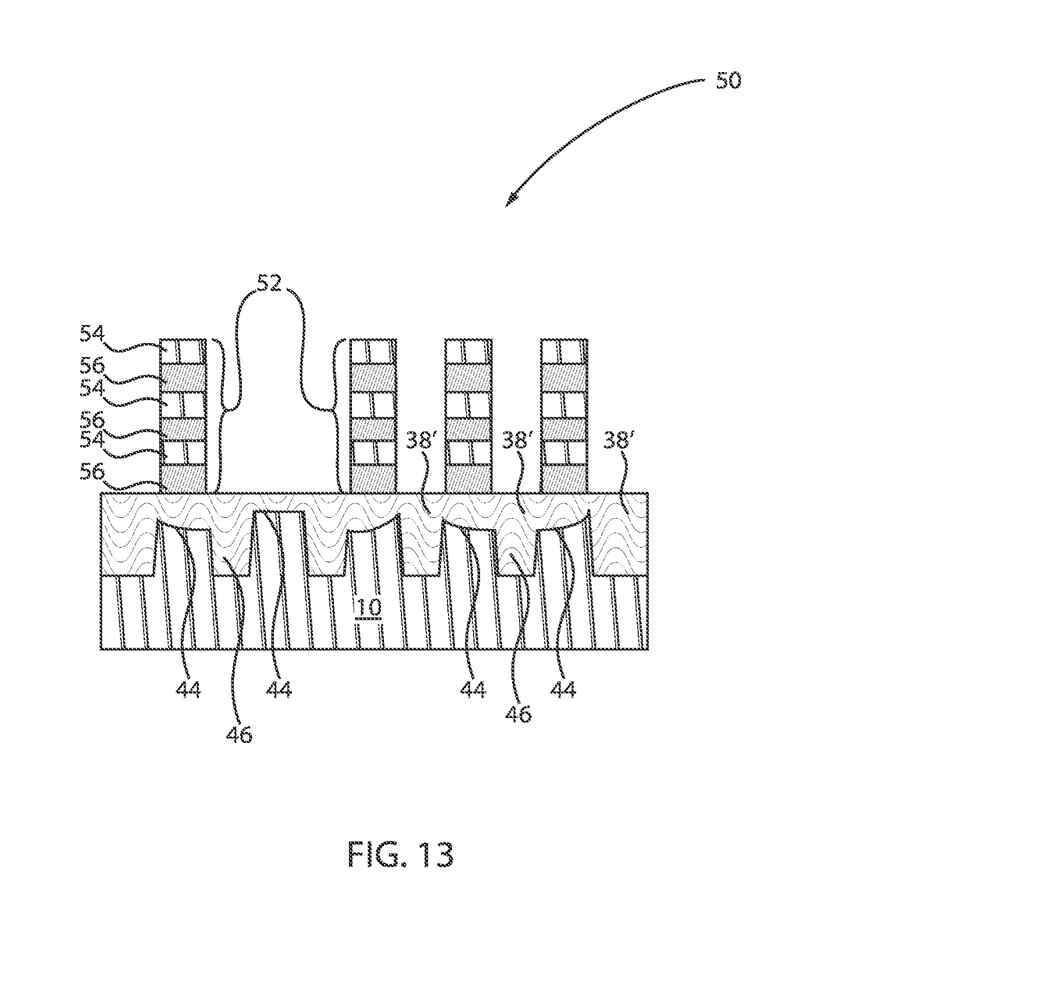
FIG. 13 is a cross-sectional view of the semiconductor structure of FIG. 12 where the fins are replaced with a nanosheet stack, in accordance with another embodiment of the present invention.

FIG. 13 is a cross-sectional view of the semiconductor structure of FIG. 12 where the fins are replaced with a nanosheet stack, in accordance with another embodiment of the present invention.

In an exemplary alternative embodiment, the structure 50 can include fins that are formed from, e.g., nanosheet stacks 52. The nanosheet stack 50 can include alternating layers of a first material 54 and a second material 56. The entire nanosheet stack 52 is isolated from the substrate 10 by a dielectric.

The first material 54 can be, e.g., silicon germanium (SiGe) and the second material 56 can be, e.g., silicon (Si). One skilled in the art can contemplate a plurality of different materials for forming the nanosheet stack. Other non-limiting examples of semiconductor materials for the first and second materials 54, 56 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

First and second nanosheets 54, 56 can be formed on the substrate 10 by for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming dielectric-isolated fins by employing shallow trench isolation (STI) as the anchor to prevent fin collapsing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for constructing dielectric isolated fins, the structure comprising:
 a plurality of fins disposed over a semiconductor substrate;
 spacers disposed adjacent each of the plurality of fins;
 bottom fin profiles constructed by recessing the semiconductor substrate;
 shallow trench isolation (STI) regions disposed between the plurality of fins and the bottom fin profiles; and
 cavities created on opposed ends of the STI regions, the STI regions defining mechanical anchors, wherein the cavities cause undercutting of each of the plurality of fins.

2. The structure of claim 1, wherein the cavities are filled with a dielectric.

3. The structure of claim 2, wherein the dielectric is recessed to expose the spacers.

4. The structure of claim 3, wherein the recessing of the dielectric results in an irregular-shaped dielectric profile.

5. The structure of claim 1, wherein the bottom fin profiles have a tapered configuration.

6. The structure of claim 1, wherein the mechanical anchors are oxide pillars.

7. The structure of claim 1, wherein each mechanical anchor of the mechanical anchors stabilizes a pair of fins of the plurality of fins.

8. The structure of claim 1, wherein the mechanical anchors prevent the plurality of fins from collapsing after the cavities are created.

9. The structure of claim 1, wherein each of the plurality of fins has a different vertical fin height after the cavities are created.

10. The structure of claim 1, wherein the bottom surface of each of the plurality of fins is non-linear after the cavities are created.

11. A semiconductor structure for constructing dielectric isolated fins, the structure comprising:
 a plurality of fins disposed over a semiconductor substrate; and an irregular-shaped dielectric profile separating the plurality of fins from the substrate the irregular-shaped dielectric profile including an oxide, wherein a bottom portion of each of the plurality of fins defines a concave shape having an outward surface and an inward surface, the inward surface facing the semiconductor substrate and the concave shape extending entirely within vertical sidewalls of each of the plurality of fins such that the oxide directly contacts the inward surface of the concave shape.

12. The structure of claim 11, wherein the irregular-shaped dielectric profile extends a length of the substrate.

13. The structure of claim 11, wherein the irregular-shaped dielectric profile defines cup-shaped sections extending into the substrate.

14. The structure of claim 11, wherein the irregular-shaped dielectric profile defines curved-shaped sections extending into the substrate.

15. The structure of claim 14, wherein the curved-shaped section are vertically aligned with the plurality of fins.

16. The structure of claim 11, wherein spacers are disposed adjacent each of the plurality of fins.

17. The structure of claim 11, wherein each of the plurality of fins has a different vertical fin height.

18. The structure of claim 11, wherein the irregular-shaped dielectric profile is asymmetrical.

19. The structure of claim 11, wherein the plurality of fins have a substantially equal height along a length of the substrate.

* * * * *